(12) United States Patent
Basceri et al.

(10) Patent No.: US 6,849,494 B2
(45) Date of Patent: *Feb. 1, 2005

(54) DIELECTRIC CURE FOR REDUCING OXYGEN VACANCIES

(75) Inventors: Cem Basceri, Boise, ID (US); Gurtej S. Sandhu, Boise, ID (US)

(73) Assignee: Micron Technology Inc., Boise, ID (US)

(*) Notice: Subject to any disclaimer, the term of this patent is extended or adjusted under 35 U.S.C. 154(b) by 1 day.

This patent is subject to a terminal disclaimer.

(21) Appl. No.: 10/444,004

(22) Filed: May 22, 2003

(65) Prior Publication Data

US 2003/0219941 A1 Nov. 27, 2003

Related U.S. Application Data

(60) Continuation of application No. 09/522,627, filed on Mar. 10, 2000, now Pat. No. 6,589,839, which is a division of application No. 09/326,429, filed on Jun. 4, 1999, now Pat. No. 6,281,142.

(51) Int. Cl.[7] .......................................... H01L 41/8242
(52) U.S. Cl. ........................... 438/239; 438/9; 438/240; 438/253; 438/466; 438/474; 438/475; 438/513; 438/675; 257/68; 257/71; 257/301; 257/303; 257/306; 257/310
(58) Field of Search ........................ 438/9, 239–240, 438/253, 387, 404, 466, 474–475, 513–516, 675; 257/68–71, 296–306, 310

(56) References Cited

U.S. PATENT DOCUMENTS

| 3,573,753 A | * | 4/1971 | Skelley et al. ............. 365/118 |
| 3,972,059 A | * | 7/1976 | DiStefano .................... 257/30 |
| 4,000,046 A | * | 12/1976 | Weaver ....................... 205/103 |
| 4,806,199 A | * | 2/1989 | Gualandris ................... 438/712 |
| 5,187,638 A | | 2/1993 | Sandhu et al. |
| 5,236,573 A | | 8/1993 | Shannon |
| 5,335,138 A | | 8/1994 | Sandhu et al. |
| 5,340,765 A | | 8/1994 | Dennison et al. |
| 5,343,421 A | * | 8/1994 | Brennan ....................... 365/145 |
| 5,485,294 A | | 1/1996 | Sugiyama et al. |
| 5,608,247 A | | 3/1997 | Brown |
| 5,770,498 A | | 6/1998 | Becker |

(List continued on next page.)

FOREIGN PATENT DOCUMENTS

| JP | 52-153200 | * 12/1977 | ............ H01B/3/12 |
| JP | 63-089405 | * 4/1988 | ............ C01B/13/14 |

OTHER PUBLICATIONS

Lo et al. "Modeling the roles of oxygen vacancies in thin film ferroelectric memory" Applications of ferroelectrics, 2000 ISAF 2000. Proceedings of the 2000 12th international symposium on vol. 1 Jul. 21–Aug. 2, 2000. p. 157–160.*

(List continued on next page.)

Primary Examiner—Matthew Smith
Assistant Examiner—Granvill David Lee, Jr.
(74) Attorney, Agent, or Firm—Knobbe Martens Olson & Bear LLP

(57) ABSTRACT

A unique electrochemical process fills oxygen vacancies in dielectrics while reducing oxidation of nearby electrodes and conductors. Preferably, an electromagnetic field or bias is applied to a dielectric. The bias causes oxygen vacancies in the dielectric to migrate to the surface of the dielectric. As the oxygen vacancies migrate toward the surface, oxygen ions fill the oxygen vacancies. In one embodiment, a unique plasma treatment provides the oxygen ions that react with the oxygen vacancies. In another embodiment, a unique electrolysis treatment provides the oxygen ions that react with the oxygen vacancies.

120 Claims, 6 Drawing Sheets

U.S. PATENT DOCUMENTS

| | | | |
|---|---|---|---|
| 5,814,852 A | | 9/1998 | Sandhu et al. |
| 5,837,593 A | | 11/1998 | Park et al. |
| 5,859,760 A | | 1/1999 | Park et al. |
| 5,872,041 A | | 2/1999 | Lee et al. |
| 5,889,647 A | | 3/1999 | Hansen et al. |
| 5,907,470 A | | 5/1999 | Kita et al. |
| 5,956,587 A | | 9/1999 | Chen et al. |
| 5,994,183 A | | 11/1999 | Huang et al. |
| 6,048,763 A | | 4/2000 | Doan et al. |
| 6,051,858 A | * | 4/2000 | Uchida et al. ............... 257/295 |
| RE36,786 E | | 7/2000 | Fazan et al. |
| 6,124,164 A | | 9/2000 | Al-Shareef et al. |
| 6,147,507 A | * | 11/2000 | Shabde et al. .............. 324/766 |
| 6,153,490 A | | 11/2000 | Xing et al. |
| 6,177,351 B1 | | 1/2001 | Beratan et al. |
| 6,200,875 B1 | | 3/2001 | Jang et al. |
| 6,271,131 B1 | * | 8/2001 | Uhlenbrock et al. ........ 438/681 |
| 6,281,142 B1 | * | 8/2001 | Basceri et al. .............. 438/771 |
| 6,445,023 B1 | * | 9/2002 | Vaartstra et al. ............ 257/295 |
| 6,589,839 B1 | * | 7/2003 | Basceri et al. .............. 438/254 |
| 6,750,500 B1 | * | 6/2004 | Agarwal ..................... 257/310 |

OTHER PUBLICATIONS

Shinriki, H. "UV–O3 and dry–O2; two–step annealed chemical vapor–deposited ta2o5 films for storage dielectrics of 64–mb dram" IEEE Transactions on electron devices vol. 38 no. 3 Mar. 1991 p. 455–462.*

* cited by examiner

DIELECTRIC CURE FOR REDUCING OXYGEN VACANCIES

CROSS REFERENCE TO RELATED APPLICATIONS

This application is a continuation of U.S. application Ser. No. 09/522,627, filed on Mar. 10, 2000 now U.S. Pat. No. 6,589,839, which is a divisional of U.S. application Ser. No. 09/326,429, filed on Jun. 4, 1999, now U.S. Pat. No. 6,281,142, the entirety of which are hereby incorporated herein by reference.

BACKGROUND OF THE INVENTION

1. Field of the Invention

The present invention relates generally to integrated circuits. In particular, the invention relates to dielectrics with reduced oxygen vacancies and methods of providing the same.

2. Description of the Related Art

Manufacturers of integrated circuits are continually increasing circuit density in pursuit of faster processing speeds and lower power consumption. As the packing density of memory cells continues to increase, components such as capacitors must still maintain a certain minimum charge storage to ensure reliable operation of the memory cell. It is thus increasingly important that capacitors achieve a high stored charge per footprint or unit of chip area occupied.

Several techniques increase the total charge capacity of the cell capacitor without significantly affecting the chip area occupied by the cell. One technique is to use dielectric materials having higher dielectric constants (k). Such materials include tantalum pentoxide (Ta2O5), barium strontium titanate (BST), strontium titanate (ST), barium titanate (BT), lead zirconium titanate (PZT), and strontium bismuth tantalate (SBT). Using such materials enables the creation of much smaller and simpler capacitor structures for a given stored charge requirement, enabling the packing density dictated by future circuit design.

Manufacturers, however, have encountered difficulties in incorporating these materials into the fabrication process because materials with higher dielectric constants often develop defects associated with oxygen vacancies (missing oxygen atoms in the crystal lattice). For example, when depositing barium strontium titanate, the barium strontium titanate can have missing oxygen atoms that may deform its crystalline structure and yield poor dielectric properties.

To reduce the oxygen vacancies, manufacturers often subject dielectric materials to re-oxidation anneals after their depositions. Conventional re-oxidation anneals typically heat the integrated circuit in an oxidizing environment. Ordinarily, such a process is highly oxidizing and can thus degrade other substances in the integrated circuit. For example, a re-oxidation anneal can degrade materials used in capacitor plates, electrodes, conductive plugs, the silicon substrate and the like. Such degradation can reduce the reliability of these electrical elements, and has been viewed as a significant obstacle to incorporating high dielectric materials into integrated circuits. Indeed, in some instances, manufacturers have added protective barrier layers to reduce the degradation thereby further increasing costs and fabrication complexity. Such protective barrier layers may exist, for example, between a bottom electrode material and a polysilicon plug.

SUMMARY OF THE INVENTION

A unique electrochemical process fills oxygen vacancies in dielectrics while reducing oxidation of nearby electrodes and conductors. For example, in one embodiment, an electromagnetic field moves oxygen vacancies to the surface of a dielectric film. Annihilation of oxygen vacancies can then be realized by an oxidizing treatment while the electromagnetic field continues to be applied. That is, the oxygen treatment removes the oxygen vacancies as the electromagnetic field directs the oxygen vacancy towards the surface of the dielectric film. The oxygen treatment can include ozone ($O_3$), nitrous oxide ($N_2O$), oxygen ($O_2$), or the like.

In one embodiment, a unique plasma treatment provides the oxygen ions that react with the oxygen vacancies. In another embodiment, a unique electrolysis treatment provides the oxygen ions that react with the oxygen vacancies.

Another embodiment of the invention relates to a method of reducing oxygen vacancies in a high dielectric constant capacitor. The method comprises depositing a first electrode on a semiconductor substrate and depositing a high constant dielectric above the first electrode. The high constant dielectric has a plurality of oxygen vacancies therein. The method further comprises applying an electrical bias to the high constant dielectric wherein the appropriate polarity of the electrical bias causes the oxygen vacancies to migrate towards the surface of the high constant dielectric. The method further comprises plasma treating the high constant dielectric with a plurality of oxygen ions at a temperature below 500° Celsius (C) wherein the oxygen ions fill at least a portion of the oxygen vacancies from the high constant dielectric.

An additional embodiment of the invention relates to a method of reducing oxygen vacancies in a dielectric. The method comprises applying an electromagnetic field to a dielectric to cause oxygen vacancies in the dielectric to migrate towards the surface of the dielectric and plasma treating the dielectric with oxygen ions which react with at least a portion of the oxygen vacancies in the dielectric.

Yet another embodiment of the invention relates to a method of reducing oxygen vacancies in a memory cell. The method comprises depositing a first electrode over a portion of a poly plug and depositing a dielectric over the first electrode. The dielectric has a plurality of oxygen vacancies therein. The method further comprises applying an electromagnetic field that causes the oxygen vacancies in the dielectric to migrate. The method further comprises plasma treating the dielectric with a plurality of oxygen ions wherein at least a portion of the oxygen ions react with the oxygen vacancies in the dielectric. The method further comprises depositing a second electrode over at least a portion of the dielectric.

One embodiment relates to a method of reducing oxygen vacancies in a metal-insulator-metal structure. The method comprises depositing a first metal electrode over a substrate and depositing a dielectric over the first metal electrode. The dielectric has a plurality of oxygen vacancies therein. The method further comprises applying an electromagnetic field that causes the oxygen vacancies in the dielectric to migrate and plasma treating the dielectric with a plurality of oxygen ions wherein at least a portion of oxygen ions fill oxygen vacancies in the dielectric. The method further comprises depositing a second metal electrode over the dielectric.

Another embodiment relates to a method of reducing oxygen vacancies in a dielectric on a semiconductor surface. The method comprises depositing on a semiconductor substrate, a high constant dielectric. The high constant dielectric has a plurality of oxygen vacancies therein. The method further comprises applying an electromagnetic field to the dielectric wherein the electromagnetic field causes the oxygen vacancies in the high constant dielectric to migrate towards the surface of the high constant dielectric. The method further comprising applying an electrolytic solution to the high constant dielectric wherein the electrolytic solution comprises at least a portion of oxygen ions that react with the oxygen vacancies to thereby fill a portion of the oxygen vacancies from the high constant dielectric.

An additional embodiment relates to a method of reducing oxygen vacancies in a dielectric. The method comprises applying an electromagnetic field to a dielectric to cause oxygen vacancies in the dielectric to migrate towards the surface of the dielectric and applying an electrolytic solution to the dielectric wherein oxygen ions in the electrolytic solution react with at least a portion of the oxygen vacancies in the dielectric.

Yet another embodiment relates to a method of reducing oxygen vacancies in a memory cell. The method comprises depositing a first electrode over a portion of a semiconductor transistor structure and depositing a dielectric over the first electrode. The dielectric has a plurality of oxygen vacancies therein. The method further comprises applying an electromagnetic field that causes the oxygen vacancies in the dielectric to migrate and subjecting the dielectric to electrolysis wherein oxygen ions react with the oxygen vacancies in the dielectric. The method further comprises depositing a second electrode over the dielectric.

One embodiment of the invention relates to a method of reducing oxygen vacancies in a metal-insulator-metal structure. The method comprises depositing a first metal electrode over a substrate and depositing a dielectric over the first metal electrode. The dielectric has a plurality of oxygen vacancies therein. The method further comprising applying an electromagnetic field that causes the oxygen vacancies in the dielectric to migrate and subjecting the dielectric to electrolysis wherein oxygen ions react with at least a portion of the oxygen vacancies in the dielectric. The method further comprises depositing a second metal electrode over the dielectric.

Another embodiment of the invention relates to a method of reducing oxygen vacancies in a dielectric. The method comprising applying an electromagnetic field to a dielectric having oxygen vacancies therein. The method further comprises applying an electrolytic solution to the dielectric wherein oxygen ions in the electrolytic solution react with at least a portion of the oxygen vacancies in the dielectric.

Yet another embodiment of the invention relates to a method of reducing oxygen vacancies in a dielectric. The method comprises applying an electromagnetic field to a dielectric to cause oxygen vacancies in the dielectric to migrate. The method further comprises applying oxygen ions to the surface of the dielectric wherein the oxygen ions react with the migrating oxygen vacancies.

One embodiment of the invention relates to semiconductor structure that comprises a poly plug substantially free of oxidation and a first electrode above at least a portion of the poly plug. The semiconductor structure further comprises a dielectric layer above at least a portion of the first electrode wherein the dielectric layer has a high dielectric constant. The semiconductor structure further comprises a second electrode above at least a portion of the dielectric layer.

Another embodiment relates to a memory cell that comprises a poly plug substantially free of oxidation and a first electrode above at least a portion of the poly plug. The memory cell further comprises a dielectric layer above at least a portion of the first electrode, the dielectric layer having a high dielectric constant. The memory cell further comprises a second electrode above at least a portion of the dielectric layer.

An additional embodiment relates to a metal-insulator-metal structure that comprises a first metal layer substantially free of oxidation and a dielectric layer above the first metal layer. The dielectric layer has a high dielectric constant. The metal-insulator-metal structure further comprising a second metal layer above the dielectric layer.

Another aspect of the invention relates to a method of reducing oxygen vacancies comprising applying an electromagnetic field that causes the oxygen vacancies in a material to migrate; and reducing the amount of oxygen vacancies by subjecting the material to an oxidizing treatment.

For purposes of summarizing the invention, certain aspects advantages and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

These and other aspects, advantages, and novel features of the invention will become apparent upon reading the following detailed description and upon reference to the accompanying drawings. The present invention is described in more detail below in connection with the attached drawings, in which.

DETAILED DESCRIPTION OF THE INVENTION

While illustrated in the context of a dynamic random access memory (DRAM) cell, embodiments of the invention can be used to improve a wide range of products and processes. For example, the invention can be used to improve materials with high dielectric constants, metal-oxide-semiconductor structures, metal-oxide-metal structures and the like.

Figure 1:
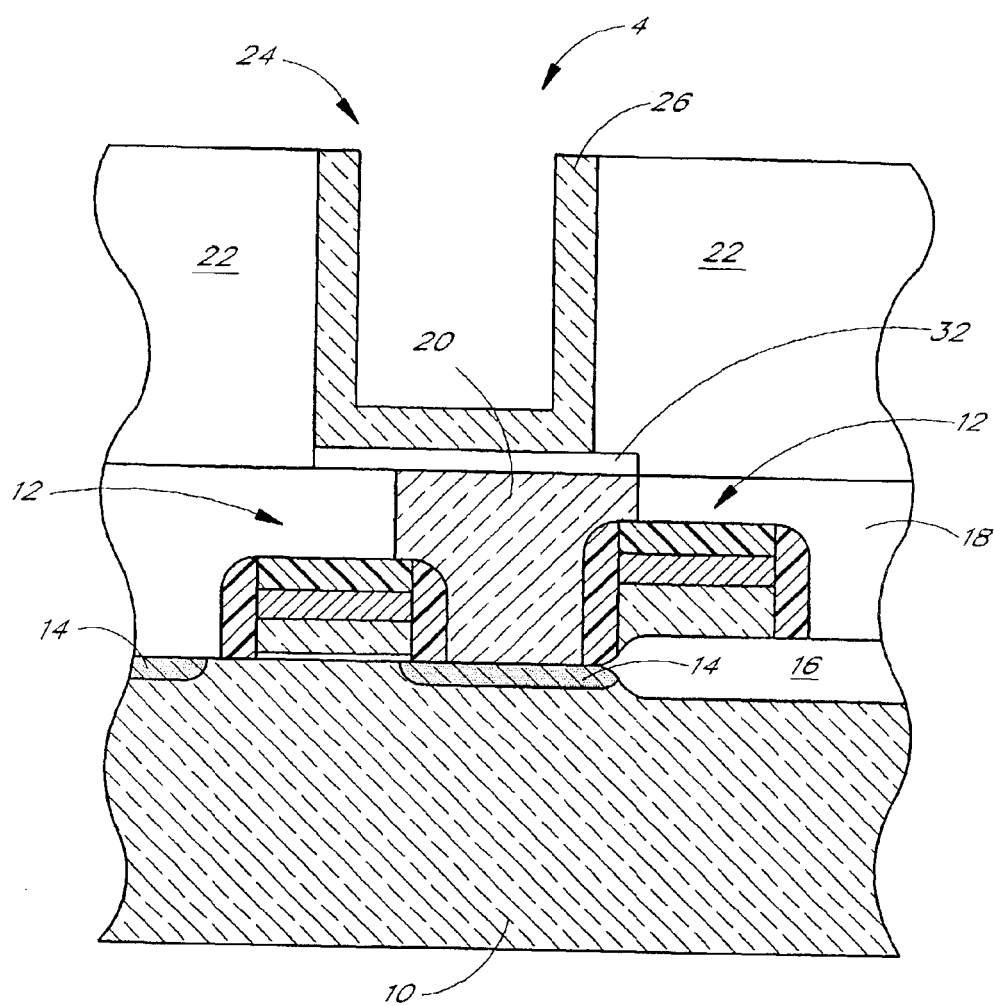
FIG. 1 is a schematic cross-section of one embodiment of a partially fabricated memory cell.

FIG. 1 illustrates a partially fabricated memory cell 4 formed within and over a semiconductor substrate 10, in accordance with one embodiment of the present invention. While the illustrated substrate 10 comprises an intrinsically doped monocrystalline silicon wafer, it will be understood by one of skill in the art of semiconductor fabrication that the "substance" in other arrangements can comprise other forms of semiconductor layers which include active or operable portions of semiconductor devices.

A plurality of transistor gate electrodes 12 overlie the substrate 10, adjacent transistor active areas 14 within the substrate 10. It will be understood that several transistors are formed across a memory array within a DRAM circuit or chip. Field oxide elements 16 isolate the active areas 14 of different transistors. In one embodiment, the width of the gates are preferably less than about 0.25 microns (μm).

A first insulating layer 18 is shown covering the gate electrodes 12. Generally, this insulating layer 18 comprises a form of oxide, such as borophosphosilicate glass (BPSG) depending upon the presence or absence of other circuit elements, the first insulating layer 18 typically has a thickness between about 0.5 μm to 1.0 μm. For example, certain DRAM circuit designs called for "buried" digit lines running below the cell capacitors, such that a thicker insulating layer is required to electrically isolated the digit line from the underlying transistors and the overlying capacitors.

A conductive contact 20 is shown extending through the first insulating layer 18 to electrically contact an active area 14 between gate electrodes. In the illustrated embodiment, the material comprises conductively doped polycrystalline silicon or polysilicon, which advantageously can be deposited into deep, narrow contact vias with good step coverage by chemical vapor deposition (CVD). In accordance with industry terminology, the conductive contact shall be referred to as a "poly plug" 20. In another embodiment, the poly plug 20 can include a variety of conductors including tungsten (W), aluminum (Al) or the like. As described in further detail below, the poly plug 20 is substantially free of oxidation that occurs when removing oxygen vacancies from the memory cell 4.

The barrier layer 32 advantageously acts as a diffusion barrier to reduce oxidation of the underlying poly plug 20 and to reduce silicon diffusion of the bottom electrode or dielectric discussed in further detail below. The barrier layer 32 may comprise stoichiometric nitride (Si3N4), tantalum (Ta), tantalum nitride (TaN), tantalum silicon nitride (TaSiN), titanium nitride (TiN), titanium aluminum nitride (TiAlN), titanium silicon nitride (TiSiN), tungsten nitride (WNx), tungsten silicon nitride (WSiN), silicon nitride (SiN), molybdenum (Mo) or the like. However, the skilled artisan will recognize that a wide range of materials can be used to form the barrier layer 32.

The barrier layer 32 can be formed by nitridizing the poly plug 20 or by chemical vapor deposition (CVD), metal organic chemical vapor deposition (MOCVD), low temperature sputtering or the like. In one embodiment, the barrier layer 32 is approximately 10 angstroms (Å) to approximately 1000 or more angstroms (Å) thick. In certain other embodiments, the barrier layer 32 is not used.

A structural layer 22 is then formed over the first insulating layer 18 and the barrier layer 32. As will be better understood from the methods described below, this structural layer 22 need not become a permanent part of the circuit. Accordingly, the skilled artisan has a great deal of flexibility in the selection of this material. Preferably, the structural layer 22 is selectively etchable relative to the underlying first insulating layer 18. In one embodiment, the structural layer 22 is BPSG. The surface area and thus the capacitance of the memory cell 4 is influenced by the thickness of the structural layer 22. For the illustrated circuit, using 0.25 μm resolution, the structural layer 22 preferably has a thickness of greater than about 1.0 μm, more preferably between about 1.0 μm and 2.0 μm.

A via 24 is formed in the structural layer 22 to expose the underlying poly plug 20, and a conductive layer 26 deposited over the structural layer 22 and into the via 24 to make electrical contact with the poly plug 20. The top of the structural layer 22, and the portion of the conductive layer 26 overlying the structural layer 22, can then be planarized to leave the conductive layer 26 isolated within the via 24, as shown in FIG. 1. Such planarization can be accomplished by mechanical abrasion, preferably chemically aided by etchants in a slurry in a chemical mechanical planarization or polishing (CMP) process.

The conductive layer 26 serves as the bottom or reference electrode of the memory cell 4, and can comprise a conductively doped polysilicon, hemispherical grain (HSG) polysilicon, platinum (Pt), ruthenium (Ru), ruthenium oxide (RuOx), iridium (Ir), iridium oxide (IrOx), palladium (Pd), tungsten (W) tungsten nitride (WNx), tantalum nitride (TaN), titanium nitride (TiN), titanium oxygen nitride (TiON) or the like. The illustrated conductive layer 26 thus takes on a three-dimensional folding shape that is of greater surface area than the area of the substrate 10 which the memory cell 4 occupies. Other methods of increasing surface area can include creating a rough surface on the conductive layer 26, or creating multiple concentric container shapes for one memory cell. The skilled artisan will find application for the processes and materials discussed below for any of a number of capacitor configurations.

The conductive layer 26 can be deposited by chemical vapor deposition (CVD), Low Pressure Chemical Vapor Deposition (LPCVD), metal organic chemical vapor deposition (MOCVD), plasma enhanced chemical vapor deposition (PECVD) or the like. While the thickness of the conductive layer 26 is approximately 100 angstroms (Å) to approximately 1000 (Å), the skilled artisan will recognize that the thickness of the conductive layer 26 can vary over a wide variety of ranges.

Figure 2:
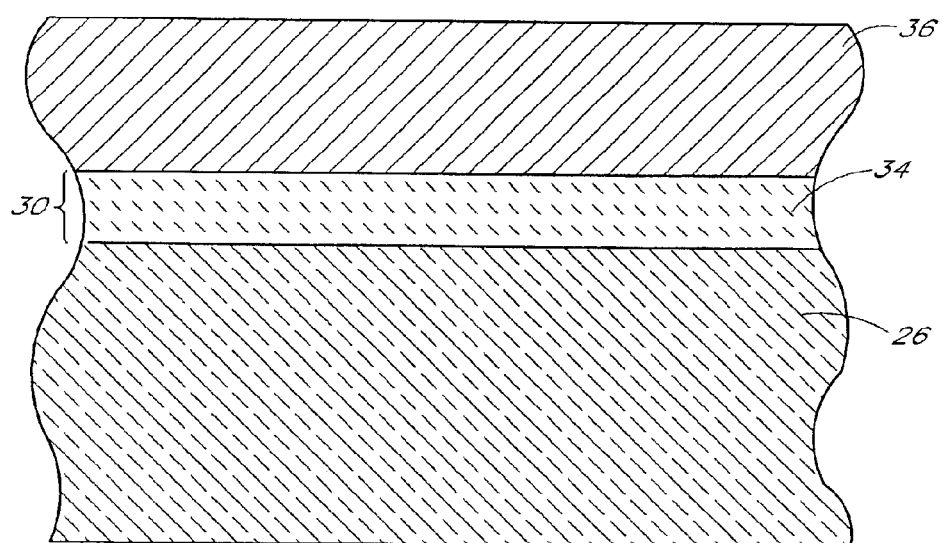
FIG. 2 is a schematic cross-section of one embodiment of a metal-insulator-semiconductor structure.

FIG. 2 illustrates a capacitor comprising a metal-insulator-semiconductor structure 30. The metal-insulator-semiconductor structure 30 comprises the conductive layer 26, a dielectric 34, and a second conductive layer 36. The conductive layer 26 is hereinafter referred to as the bottom electrode 26. In certain embodiments, the barrier layer 32 may exist between the dielectric 34 and the bottom electrode 26. In yet other embodiments, a first barrier layer 32 may exist between the dielectric 34 and the bottom electrode 26, and a second barrier layer 32 may exist between the bottom electrode 26 and the poly plug 20. In certain other embodiments, the barrier layer 32 is not used.

The dielectric 34 is an insulator that provides electrical insulation. In one embodiment of the invention, the dielectric 34 is a conventional dielectric material such as silicon dioxide or silicon nitride. In another embodiment, the dielectric 34 is a material with a high dielectric constant. Materials having high dielectric constants greater than 20 are to be distinguished from conventional dielectric materials such as silicon dioxide which as a dielectric constant of approximately 3.9. The high constant dielectric materials typically comprise inorganic non-metallic oxides such as tantalum pentoxide (Ta2O5) oxide paraelectric materials, and ferroelectric materials including by way of example, barium strontium titanate ((BaSr)TiO3 or BST), strontium titanate (ST), barium titanate (BT), lead zirconium titanate (PZT), strontium bismuth tantalate (SBT), or the like.

In one embodiment, the dielectric 34 is deposited by direct current (DC) magnetron sputtering at a temperature range of approximately 200° C. to approximately 800° C. A target material can comprise a stoichiometric composition of powered materials. The thickness of such a dielectric layer is preferably in the range of approximately 20 Å to approximately 2,500 Å thick. Other deposition techniques such as CVD, LPCVD, PECVD or MOCVD can be utilized. For example, in one embodiment, the dielectric 34 comprises tantalum pentoxide and is between approximately 40 Å and approximately 100 Å thick. Preferably, the tantalum pentoxide is approximately 60 Å thick. The dielectric constant (k) of tantalum pentoxide is 25 to 50, and when doped with silicon can increase up to 130. As is known in the art, tantalum pentoxide can be formed by chemical vapor deposition, using an organometallic precursor.

In another embodiment, the dielectric 34 comprises barium strontium titanate that is between approximately 100 Å and approximately 1000 Å thick. Preferably, the barium strontium titanate is approximately 200 Å to approximately 300 Å thick. While the dielectric constant (k) of the barium strontium titanate varies from about 100 to 600, depending upon the phase and thickness of the material, the preferred dielectric 34 has a dielectric constant of about 300. As is known in the art, barium strontium titanate is preferably deposited by chemical vapor deposition techniques comprising reacting volatile complexes containing barium (Ba), strontium (Sr) and titanium (Ti) in an oxygen ambient.

During the deposition of the dielectric 34, oxygen vacancies often develop wherein oxygen atoms are missing in the crystal lattice of the dielectric 34. For example, the tantalum pentoxide or barium strontium titanate may contain defects where missing oxygen atoms deform their crystalline structures and yield poor dielectric properties such as lower dielectric constants and higher leakage. As explained in more detail below, one embodiment of the invention reduces the oxygen vacancies in the dielectric 34 by subjecting the dielectric 34 to an electromagnetic field and a plasma treatment at relatively low temperatures. Another embodiment of the invention subjects the dielectric 34 to an electromagnetic field and electrolysis at relatively low temperatures. Thereafter, the deposited amorphous dielectric 34 can be converted to a crystalline phase during a relatively quick high-temperature, non-oxidizing reflow that does not significantly degrade the poly plug 20, the barrier layer 32 and/or the bottom electrode 26.

After depositing and treating the dielectric 34, the second conductive layer 36 is deposited over the dielectric 34. The second conductive layer 36 typically comprises platinum (Pt), ruthenium (Ru), ruthenium oxide (RuOx), iridium (Ir), iridium oxide (IrOx), palladium (Pd), tungsten (W), tungsten nitride (WN), tantalum nitride (TaN), titanium nitride (TiN), titanium oxygen nitride (TiON), or the like. A suitable deposition process is sputtering, CVD, LPCVD, PECVD, MOCVD or the like. The second conductive layer 36 is preferably deposited to a thickness range of approximately 100 Å to approximately 2000 Å.

Figure 3:
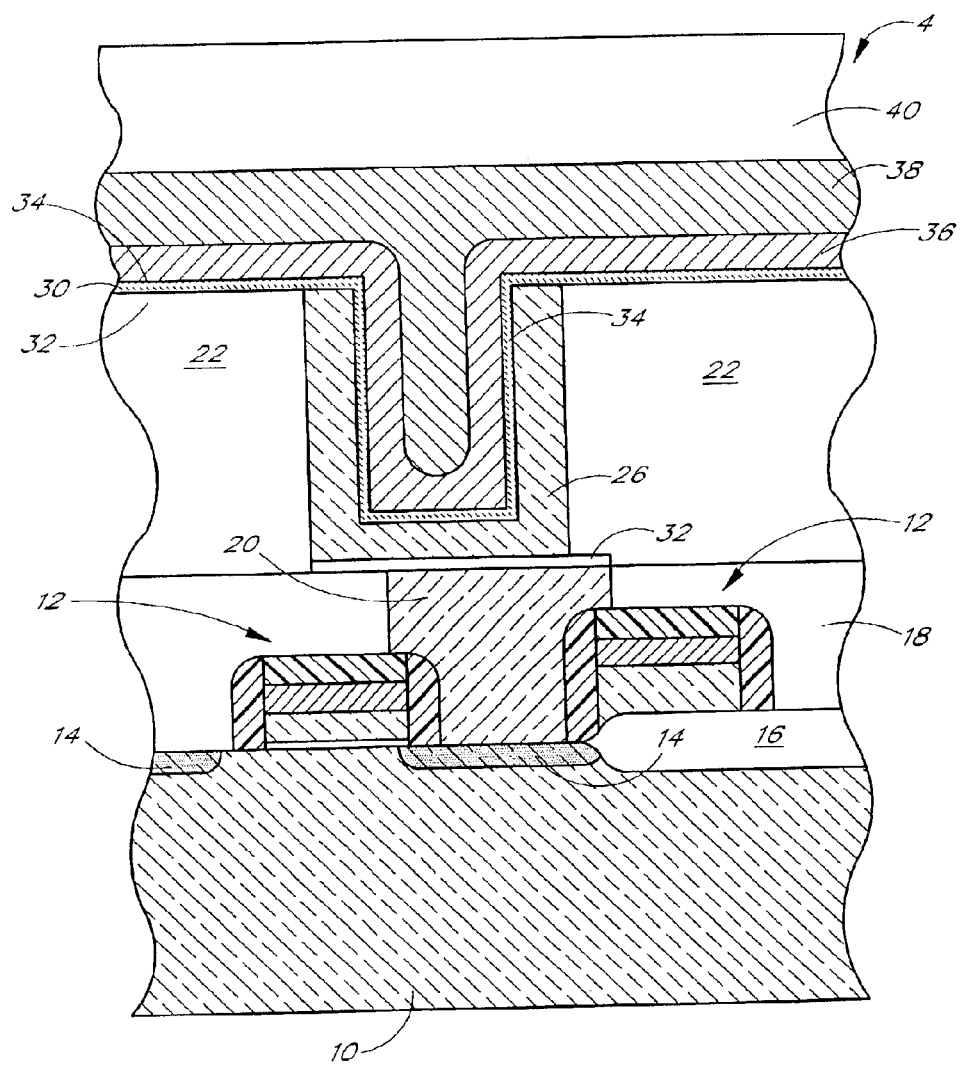
FIG. 3 shows the memory cell of FIG. 1, incorporating the metal-insulator-semiconductor structure of FIG. 2 with an overlying dielectric.

With reference now to FIG. 3, the memory cell 4 is shown with a completed capacitor structure. A third conductive layer 38 may exist above the second conductive layer 36, preferably the third conductive layer 38 forms a part of the top electrode. Exemplary materials for the third conductive layer 38 include polysilicon, tungsten.

An interlevel dielectric (ILD) 40 has also been formed over the second conductive layer 36. Typically, the ILD 40 comprises a form of oxide, such as borophosphosilicate glass (BPSG). Deposition of the BPSG is followed by a reflow anneal step for better step coverage and avoiding keyholes, as well as to densify the layer. The reflow is conducted by heating the wafer to temperatures of approximately 900° C. to 1000° C. If not separately annealed before this point, the deposited amorphous dielectric 34 can be converted to a crystalline phase during this high temperature reflow. Although not shown, the skilled artisan will appreciate that contacts are created through the BPSG 40 to connect the top electrode 36, 38 to wiring formed above or within the BPSG 40.

Figure 4:
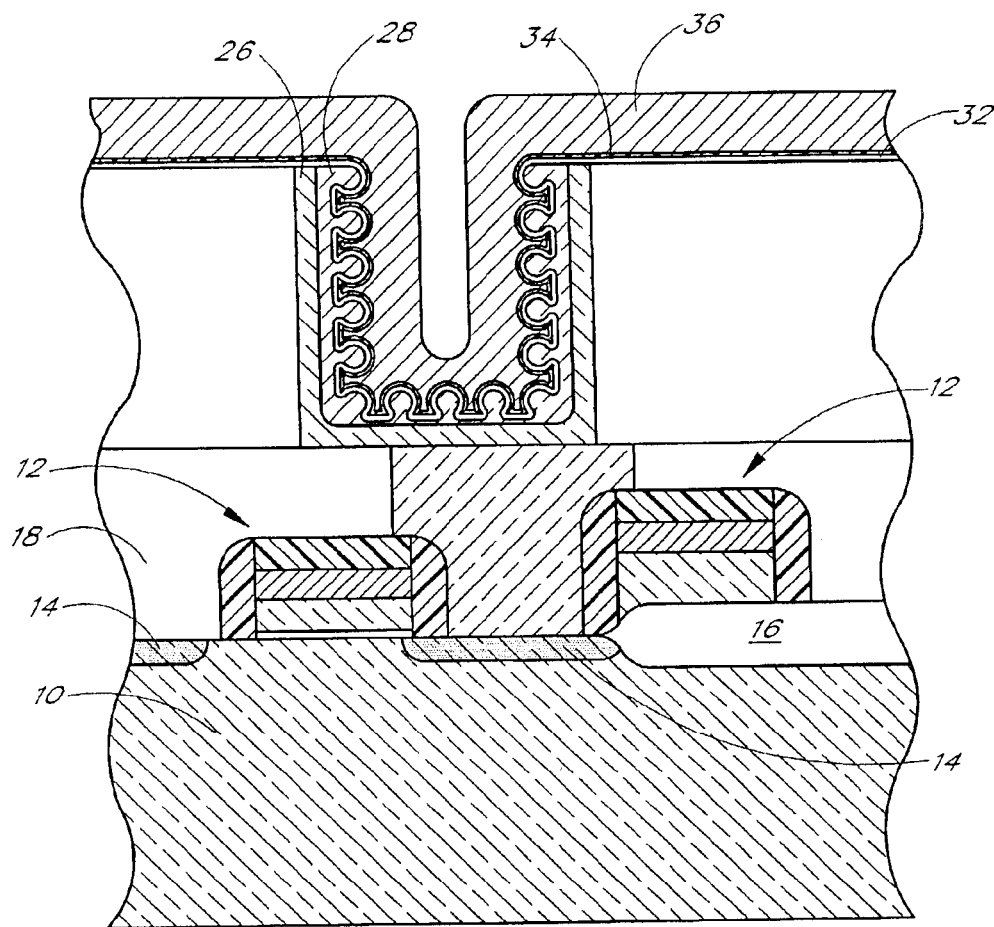
FIG. 4 is a schematic cross-section of another embodiment of a partially fabricated memory cell with a roughened surface.

FIG. 4 illustrates another embodiment of memory cell 4 made in accordance with an embodiment of the invention. As discussed with respect to FIG. 1, the memory cell 4 comprises the semiconductor substrate 10, the plurality of transistor gate electrodes 12, the adjacent transistor active areas 14, the field oxide elements 16, the first insulating layer 18 and the "poly plug" 20. A structural layer 22 is then formed over the first insulating layer 18. A via 24 is formed in the structural layer 22 to expose the underlying poly plug 20.

The bottom electrode 26 includes a rugged or rough silicon layer 28. The rough silicon layer 28 enhances the surface area of the bottom electrode 26. The rough silicon layer 28 typically comprises hemispherical grained (HSG) silicon or HSG polysilicon. The rough silicon layer 28 may be formed by a number of different methods, including gas phase nucleation and surface seeding.

The barrier layer 32 and the dielectric 34 are then layered upon the rough surface of the bottom electrode 26. The barrier layer 32 comprises the substances discussed above. For example, when tantalum pentoxide is used as the dielectric 34, a nitrided poly surface may be used as the barrier layer 32.

The dielectric 34 is typically coated with the second conductive layer 36 to form a metal-insulator-semiconductor structure. The barrier layer 32 advantageously acts as a diffusion barrier to reduce oxidation of the underlying bottom electrode 26. For example, the poly oxidation is reduced by the nitride barrier layer 32.

The dielectric 34 is a material with a high dielectric constant wherein the oxygen vacancies in the dielectric 34 have been reduced with an electromagnetic field. In another embodiment, the invention reduces the oxygen vacancies in the dielectric 34 with a unique electrolysis technique.

The second conductive layer 36 is then deposited on the dielectric 34. The second conductive layer 36 may comprise titanium nitride (TiN), tantalum nitride (TaN), titanium oxygen nitride (TiON), tungsten (W), tungsten nitride (WN), or the like that is deposited with conventional techniques. Also, a third conductive layer may comprise polysilicon deposited with chemical vapor deposition techniques on the second conductive layer 36. In one embodiment, the second conductive layer 36 is deposited by chemical vapor deposition and may have a thickness of about 200 to 400 Å.

Figure 5:
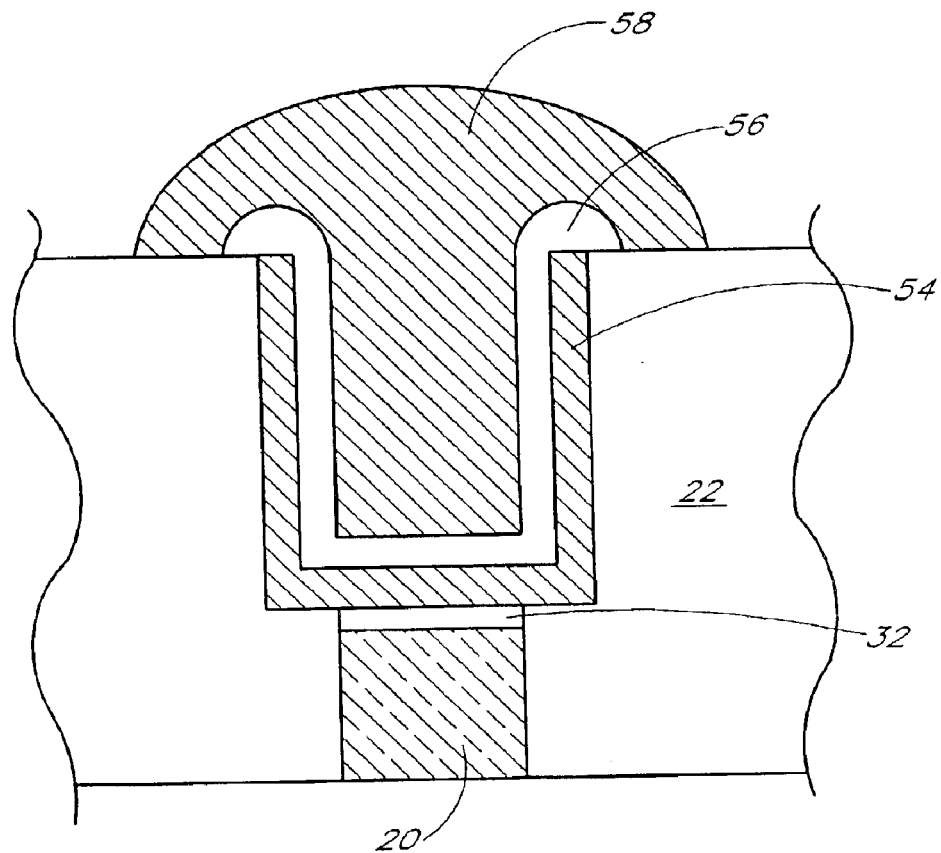
FIG. 5 is a schematic cross-section of an embodiment of a metal-insulator-metal semiconductor structure.

FIG. 5 illustrates a metal-insulator-metal structure 50. The metal-insulator-metal structure 50 is hereinafter referred to as the MIM 50. The MIM 50 comprises the poly plug 20, the barrier layer 32, the structural layer 22, a first electrode 54, a dielectric 56, and a second electrode 58. The MIM 50 has a wide variety of uses including dynamic random access memory capacitor modules, electro-optical devices, liquid crystal displays, diode structures and the like.

The barrier layer 32 as discussed above, reduces oxidation of the poly plug 20 and reduces silicon diffusion to the first electrode 54 and the dielectric 56. The first electrode 54 comprises iridium (Ir), iridium oxide (IrOx), ruthenium (Ru), ruthenium oxide (RuOx), tantalum (Ta), tantalum nitride (TaN), titanium (Ti), titanium nitride (TiN), titanium oxygen nitride (TiON), tungsten (W), tungsten nitride (WNx), molybdenum (Mo), platinum (Pt), silver (Ag), palladium (Pd) and the like.

The dielectric 56 comprises a dielectric material such as polyimide, silicon oxynitride, silicon nitride, tantalum pentoxide (Ta2O5), barium strontium titanate (BST), strontium titanate (ST), barium titanate (BT), lead zirconium titanate (PZT), strontium bismuth tantalate (SBT), or the like. The second electrode 58, like the first electrode 54, comprises iridium (Ir), iridium oxide (IrOx), ruthenium (Ru), ruthenium oxide (RuOx), tantalum (Ta), tantalum nitride (TaN), titanium (Ti), titanium nitride (TiN), titanium oxygen nitride (TiON), tungsten (W), tungsten nitride (WNx), molybdenum (Mo), platinum (Pt), silver (Ag), palladium (Pd), or the like The amount of charge stored on the capacitor of the memory cell 4 or the MIM 50 is proportional to the capacitance as follows:

$$C = \frac{\varepsilon \varepsilon_o A}{d}$$

where $\varepsilon$ is the dielectric constant of the capacitor dielectric, $\varepsilon_o$ is the vacuum permittivity, A is the electrode area, and d represents the spacing between electrodes.

Thus, a dielectric 34 with a high dielectric constant can improve capacitance. One problem with incorporating dielectrics 34 with high dielectric constants into the memory cell 4 is the degradation that can occur to the bottom electrode 26 or the poly plug 20. In particular, when the dielectrics 34, 56 undergo conventional re-oxidation to remove oxygen vacancies, the re-oxidation tends to also oxidize the first electrode 54, the barrier layer 32, the poly plug 20 or the second electrode 58. The oxidation of such layers is undesirable since it has a much lower dielectric constant and adds in series to the capacitance of the dielectrics 34, 56, thus lowering the total capacitance.

Therefore, a thin native oxide layer present on the bottom electrode 26, the first electrode 54, or the poly plug 20, results in a large degradation in capacitance. Furthermore, even when the bottom electrode 26 is made of a noble metal, such as platinum (Pt), the oxygen in conventional re-oxidation processes may diffuse through the platinum, contaminating the underlying poly plug 20.

Reduction of Oxygen Vacancies

As discussed above, the dielectric 34 in the memory cell 4 and the dielectric 56 in the MIM 50 structure often develop defects associated with oxygen vacancies (missing oxygen atoms in the crystal lattice). Such oxygen vacancies, however, can result in high leakage currents, lower capacitance, less reliable operation and undesired dielectric properties. Furthermore, materials with oxygen vacancies are often more prone to degradation such as resistance degradation.

Oxygen vacancies in high constant dielectric constant materials such as the dielectric 34 are mobile under certain conditions. The invention uses this mobility to attract the oxygen vacancies towards the surface of the dielectric 34, 56. Once the oxygen vacancies near the surface, oxygen ions in the environment are used to fill the oxygen vacancies. The following reaction represents the presence of oxygen vacancies:

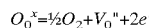

where, in accordance with Kroger-Vink notation, $O^x{}_O$ denotes the location of an oxygen vacancy within the crystalline lattice, $\frac{1}{2}O_2$ denotes molecular oxygen in a gaseous phase, $V''_O$ denotes an oxygen vacancy in the crystalline lattice with an effective charge of +2 with respect to the perfect crystalline lattice, and e' denotes an electron with an effective charge of −1.

On the other hand, oxygen ion formation can be represented as:

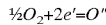

where, in accordance with Kroger-Vink notation, $\frac{1}{2}O_2$ denotes molecular oxygen in a gaseous phase, e' denotes an electron with an effective charge of −1 and O'' denotes oxygen ions with an effective charge of −2.

Reduction of Oxygen Vacancies with an Electromagnetic Field

Figure 6:
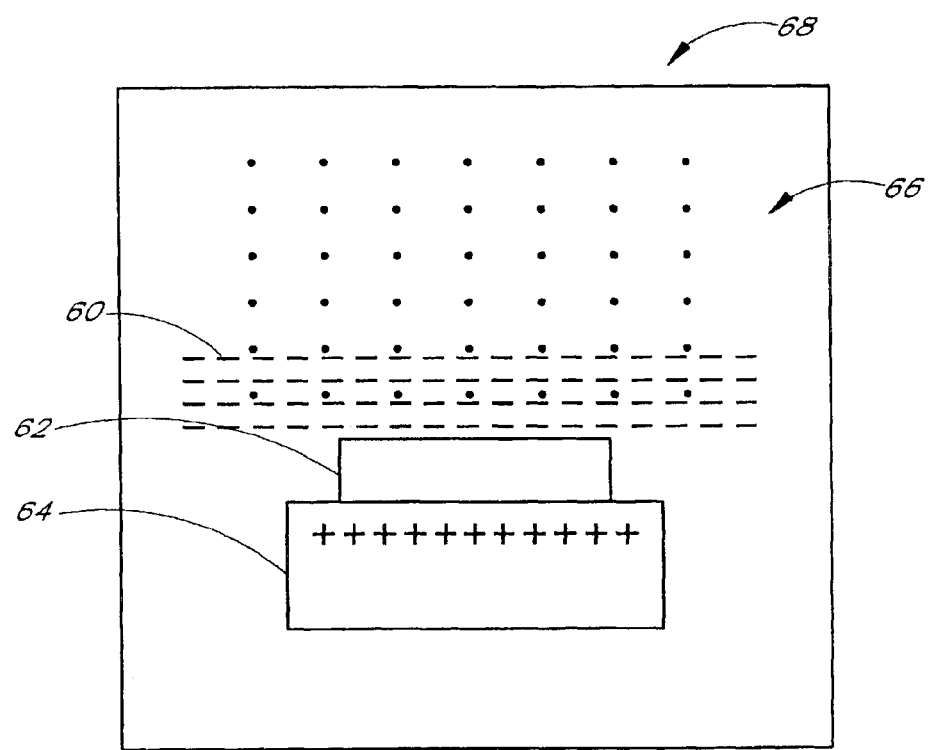
FIG. 6 shows a wafer subjected to an electromagnetic field in one embodiment of the invention.

To fill the oxygen vacancies, one embodiment of the invention, as illustrated in FIG. 6, uses a unique plasma treatment that subjects the dielectrics 34, 56 to an electric, magnetic or electromagnetic field 60. The electromagnetic field 60 is hereinafter referred to as the bias 60. For example, after the dielectric 34 has been deposited on the barrier layer 32 or the bottom electrode 26, the dielectric 34 is subjected to a bias 60. The bias 60 comprises a magnetic field, a voltage, a current, a bias or the like.

Oxygen vacancies in a dielectric 34 are mobile under forces from the bias 60. Depending on the polarity of the bias 60, the oxygen vacancies can migrate towards or away from an upper surface of the dielectric 34. Thus, when the bias 60 is applied to the dielectrics 34, 56 the oxygen vacancies can migrate to the surface of the dielectrics 34, 56. At the surface, the oxygen vacancies can be reduced with oxygen ions present in the environment.

As illustrated in FIG. 6, a radio frequency (RF) power source creates a plasma 66 within a chamber 68. The plasma 66 can comprise any substance that creates oxygen ions including, but not limited to oxygen (O2), nitrous oxide (N2O), ozone (O3) or the like. A wafer 62 comprising the memory cell 4 or MIM 50 is connected to a positive voltage source 64. Therefore, the wafer 62 has a positive bias 60 relative to the plasma 66. The positive bias 60 causes the oxygen vacancies to migrate towards the surface of the dielectrics 34, 56. At the surface, the oxygen vacancies combine with the oxygen ions in the plasma 66.

The voltage of the bias 60 can be either positive or negative depending on the desired direction of the oxygen vacancy migration. Furthermore, the amount of the voltage is tuned for the resistance degradation characteristics of the dielectric 34, 56, the type of plasma 66, the environmental temperature of the chamber 68, the length of time the wafer 62 is subjected to the plasma treatment, etc. In one embodiment, the amount of the bias 60 is selected based on the number of oxygen vacancies, the temperature of the plasma treatment, the length of time of the plasma treatment. In one embodiment, the electric field ranges from approximately 250 to approximately 2,000 kilovolt per centimeter (kV/cm).

One advantage is that migrating oxygen vacancies with an electric field can significantly decrease the temperature required for re-oxidation. In one embodiment, the environmental temperature preferably ranges from approximately 300° C. to approximately 400° C. during re-oxidation. In other embodiments, the environmental temperature ranges from approximately 20° C. to approximately 500° C. during re-oxidation.

The length of time the bias 60 and the plasma 66 are applied to the wafer 62 can vary depending the desired operating parameters. In one embodiment, the length of time varies from approximately 20 seconds to approximately 600 seconds, and is preferably approximately 2 minutes.

Such a plasma treatment can be performed, for example, in a conventional plasma chamber 68 or conventional in-situ plasma chamber 68. Exemplary parameters include a chamber pressure from approximately 1 mTorr to approximately 10 Torr, RF power from approximately 100 W to approximately 1,500 W. The gas flows from approximately 50 standard cubic centimeters per minute (sccm) to approximately 5000 sccm of oxygen, nitrous oxide or ozone. The skilled artisan will recognize, however, that each of the above noted parameters can be varied significantly and furthermore that different etch chemistries can be used, while still obtaining reduction of the oxygen vacancies.

For example, after the dielectric 34 has been deposited on the bottom electrode 26, the wafer 62 is subjected to the novel plasma treatment. In one embodiment, an approximately 0.5 volt bias 60 is applied to the wafer 62 for approximately 2 minutes at temperatures ranging from 300° C. to 400° C. In this example, the dielectric 34 is a BST layer that is approximately 200 Å thick and the plasma 66 comprises oxygen (O2), nitrous oxide (N2O), or ozone (O3). With the bias 60, the oxygen vacancies migrate towards the surface of the dielectric 34 where they combine with oxygen ions in the plasma 66. The oxygen vacancies in the dielectric 34 are thereby reduced.

An advantage of one embodiment of the plasma treatment is that the removal of the oxygen vacancies in the dielectric 34 does not substantially oxidize or degrade the poly plug 20. Unlike conventional high-temperature anneals, the oxygen ions in the plasma treatment do not generally diffuse through the barrier layer 32 or the bottom electrode 26 to significantly oxidize or degrade the poly plug 20. Thus, some embodiments can eliminate the barrier layer 32. For embodiments without the barrier layer 32, the oxygen ions in the plasma treatment do not generally diffuse through the bottom electrode to significantly degrade or oxidize the poly plug 20. Thus, after reducing the number of oxygen vacancies in the dielectric 34, the poly plug 20 remains substantially free of oxidation.

The deposited amorphous dielectric 34 can be converted to a crystalline phase during a relatively quick high-temperature, non-oxidizing reflow. For example, the dielectric 34 comprising tantalum pentoxide or BST can be subjected to a rapid thermal anneal in an nitrogen (N2) environment from approximately 30 to approximately 60 seconds at temperatures exceeding 500° C. The rapid thermal anneal reduces the degradation or oxidation that can occur to the poly plug 20. Thereafter, the second conductive layer 36 is deposited on the dielectric 34.

In another example with the MIM 50, after the dielectric 56 has been deposited on the first electrode 54, the MIM 50 is subjected to the novel plasma treatment. The bias 60 is applied to the MIM 50 and the plasma 66 comprises oxygen (O2), nitrous oxide (N2O), or ozone (O3). With the bias 60, the oxygen vacancies migrate towards the surface of the dielectric 56 where they combine with oxygen ions in the plasma 66. The oxygen vacancies in the dielectric 56 are thereby reduced. Thereafter, the second electrode 58 is deposited on the dielectric 56.

An advantage of one embodiment of the plasma treatment is that the removal of the oxygen vacancies in the dielectric 34 does not substantially oxidize or degrade the first electrode 54, the barrier layer 32, and/or the poly plug 20. For example, the oxygen ions in the plasma treatment do not generally diffuse through the dielectric 34 to significantly oxidize or degrade the first electrode 54, the barrier layer 32, and/or the poly plug 20. Thus, after reducing the number of oxygen vacancies in the dielectric 34, the first electrode 54, the barrier layer 32 and/or the poly plug 20 remain substantially free of oxidation.

Another advantage of one embodiment of the invention is that the bias 60 is generally uniform throughout the wafer 62. Thus, the bias 60 is effective at reducing oxygen vacancies in variations on the surface of the wafer 62, such as side walls, roughed surfaces, and other three dimensional surfaces.

An additional advantage of one embodiment of the invention is that the environmental temperature during the plasma treatment is generally lower than in conventional high-temperature approaches exceeding approximately 500° C. Reducing oxygen vacancies at temperatures below approximately 500° C. in the memory cell 4, reduces oxidation of the bottom electrode 26 or the poly plug 20. Likewise, in the MIM 50, reducing oxygen vacancies at lower temperatures reduces the oxidation of the first electrode 54, the barrier layer 22 and/or the poly plug 20 in the MIM 50.

Because there is less oxidation to the bottom electrode 26, the poly plug 20 or the first electrode 54, the total capacitance is increased. Furthermore, more desirable bottom electrodes 26 and barrier layers 32 can be used. For example, a bottom electrode 26 comprising nitrided HSG polysilicon can retain its permittivity of approximately 7. In another example, it is possible to use platinum (Pt) as the bottom electrode 26 and conventional titanium nitride (TiN) as the barrier layer 32. Degradation due to high-temperature oxidizing conditions is thereby reduced.

In another embodiment, the barrier layer 32 does not exist between the dielectric 34 and the bottom electrode 26. In an additional embodiment, a barrier layer 32 does not exist between the bottom electrode 26 and the poly plug 20.

In yet another embodiment, the environmental temperature during the plasma treatment is generally lower than in conventional approaches. A low-temperature plasma treatment tends to reduce the time associated with performing a re-oxidation anneal thereby reducing manufacturing costs and time.

Reduction of Oxygen Vacancies with Electrolysis

Figure 7:
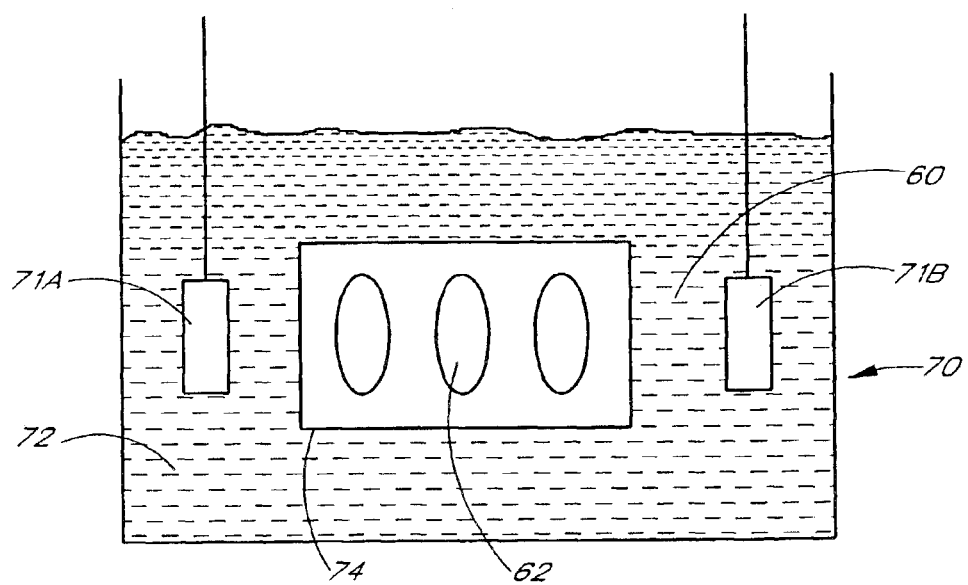
FIG. 7 shows a wafer subjected to electrolysis in accordance with one embodiment of the invention.

Another embodiment of the invention fills the oxygen vacancies with a novel electrolysis technique. FIG. 7 illustrates an electrolysis chamber 70 that contains electrodes 71A and 71B, an electrolytic solution 72, a wafer carrier 74 and one or more wafers 62. The wafers 62 are immersed in the electrolytic solution 72.

The electrolysis chamber 70 is a conventional chamber for the wet treatment of wafers 62. In one embodiment, the electrodes 71A and 71B are connected to a direct current (DC) power supply the output of which can be varied. In one embodiment, the electric strength is set based on the number of oxygen vacancies, the temperature of the electrolytic solution 72, and the amount of time the wafers 62 remain in the electrolytic solution 72. Exemplary values of the electric strength vary from approximately 250 kilovolts per centimeter (kV/cm) to approximately 2000 kV/cm.

The electrolytic solution 72 is created by bubbling oxygen or ozone in a suitable electrolyte. The electrolyte is a conductive substance that serves to decrease the electric resistance to enable operation of the electrolysis with a decreased direct-current voltage. The electrolyte is prepared by dissolving an electrolytic salt such as sodium chloride (NaCl), ammonium acetate (C2H7NO2), ammonium chloride (ClH4N) or the like into water. In other embodiments, the electrolyte is prepared by dissolving into water, alkaline compounds such as sodium hydroxide, potassium hydroxide, ammonia or the like. The concentration of the electrolyte in the aqueous solution can vary over a wide range. In other embodiments, however, the electrolyte is not used.

The temperature of the electrolysis chamber 70 can vary from approximately 20° C. to approximately 100° C. For example, in one embodiment, dielectrics 34, 56 comprise barium strontium titanate that is subjected to electrolysis at temperatures less than 100° C.

The electrolytic solution 72 is subjected to the bias 60 from the electrodes 71A and 71B. Oxygen ions are then created by bubbling oxygen, ozone or nitrous oxide in the electrolytic solution 72. The DC voltage driving the electrodes 71A and 71B generates a bias 60 having an electric field, whereby the electrolytic solution 72 is electrolyzed. The polarity of the bias 60 is set so that the oxygen vacancies in the dielectric 34, 56 migrate towards the electrolytic solution 72. As the oxygen vacancies migrate towards the surface of the dielectric 34, 56, the oxygen ions in the electrolytic solution 72 combine with the oxygen vacancies and thereby reduce the number of oxygen vacancies in the dielectric 34, 56.

For example, after the dielectric 34 has been deposited on the bottom electrode 26, the wafer 62 is placed in the electrolytic solution 72. In this example, the dielectric 34 is a BST layer that is approximately 200 Å thick. Oxygen ions are created within the electrolytic solution 72 by bubbling oxygen (O2), nitrous oxide (N2O), or ozone (O3) into the electrolytic solution. A bias 60 is applied to the electrolytic solution 72 that causes the oxygen vacancies in the BST layer to migrate towards the surface of the dielectric 34, 56 where they combine with oxygen ions in the electrolytic solution 72. The oxygen vacancies in the dielectric 34 are thereby reduced.

In another embodiment, oxygen ions are not created by bubbling oxygen, ozone or nitrous oxide in the electrolytic solution 72. Rather, the migration of the oxygen vacancies to the surface of the dielectric 34, 56 combine with available oxygen ions in the electrolytic solution 72.

An advantage of one embodiment of the electrolytic treatment is that the removal of the oxygen vacancies in the dielectric 34 does not substantially oxidize or degrade the poly plug 20. For example, the oxygen ions in the electrolytic solution 772 do not generally diffuse through the barrier layer 32 or the bottom electrode 26 to significantly oxidize or degrade the poly plug 20. For embodiments without the barrier layer 32, the oxygen ions in the electrolytic solution 72 do not generally diffuse through the bottom electrode to significantly degrade or oxidize the poly plug 20. Thus, after reducing the number of oxygen vacancies in the dielectric 34, the poly plug 20 remains substantially free of oxidation.

The deposited amorphous dielectric 34 can then be converted to a crystalline phase during a relatively quick high-temperature reflow. For example, a dielectric 34 comprising tantalum pentoxide or BST can be subjected to a rapid thermal anneal in a nitrogen (N2) environment from approximately 30 to approximately 60 seconds at temperatures exceeding 500° C. The rapid thermal anneal also reduces the degradation or oxidation that can occur to the poly plug 20. Thereafter, the second conductive layer 36 is deposited on the dielectric 34.

In another example with the MIM 50, after the dielectric 56 has been deposited on the first electrode 54, the MIM 50 is subjected to the novel electrolysis treatment. The MIM 50 is placed in the electrolytic solution 72. The bias 60 is applied to the MIM 50 and the oxygen vacancies migrate towards the surface of the dielectric 56 where they combine with oxygen ions in the electrolytic solution 72. The oxygen vacancies in the dielectric 56 are thereby reduced.

An advantage of one embodiment of the electrolytic treatment is that the removal of the oxygen vacancies in the dielectric 34 does not substantially oxidize or degrade the first electrode 54, the barrier layer 32, and/or poly plug 20. For example, the oxygen ions in the plasma treatment do not generally diffuse through the dielectric 34 to significantly oxidize or degrade the first electrode 54, the barrier layer 32, and/or poly plug 20. Thus, after reducing the number of oxygen vacancies in the dielectric 34, the first electrode 54, the barrier layer 32, and/or poly plug 20 remain substantially free of oxidation. Thereafter, the second electrode 58 is deposited on the dielectric 56.

An advantage of the novel electrolysis treatment is that the electrolytic solution 72 and the bias 60 are generally uniform throughout the surface of the wafer 62. Thus, the electrolysis treatment is effective at reducing oxygen vacancies that exist in three-dimensional surfaces such as sidewalls, roughed surfaces, and the like.

An additional advantage of one embodiment of the electrolysis treatment is that the barrier layer 32 can be eliminated. Furthermore, the environmental temperature is generally lower than in conventional high-temperature approaches exceeding approximately 500° C. Reducing oxygen vacancies at temperatures below approximately 100° C. reduces oxidation of the bottom electrode 26 or the poly plug 20. Likewise, in the MIM 50, reducing oxygen vacancies at lower temperatures reduces the oxidation of the first electrode 54 and the poly plug 20.

Because there is less oxidation to the bottom electrode 26, the poly plug 20 or the first electrode 54 the total capacitance increases. Furthermore, more desirable bottom electrodes 26 and barrier layers 32 can be used. For example, a bottom electrode 26 comprising nitrided HSG polysilicon can retain its permittivity of approximately 7. In another example, it is possible to use platinum (Pt) as the bottom electrode 26 and conventional titanium nitride (TiN) as the barrier layer 32. Degradation due to high-temperature oxidizing conditions is thereby reduced.

In another embodiment, the barrier layer 32 does not exist between the dielectric 34 and the bottom electrode 26. In an additional embodiment, a barrier layer 32 does not exist between the bottom electrode 26 and the poly plug 20.

In yet another embodiment, the environmental temperature during the plasma treatment is generally lower than in conventional approaches. A low-temperature plasma treatment tends to reduce the time associated with performing a re-oxidation anneal thereby reducing manufacturing costs and time.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

What is claimed is:

1. A method of reducing oxygen vacancies in a high dielectric constant capacitor comprising:

depositing a first electrode on a semiconductor substrate;

depositing a dielectric with a high dielectric constant above the first electrode, the dielectric having a plurality of oxygen vacancies therein;

applying a bias to the dielectric wherein a polarity of the bias causes the oxygen vacancies to migrate towards the surface of the dielectric; and plasma treating the dielectric wherein a plasma comprises oxygen ions that react with the oxygen vacancies to fill at least a portion of the oxygen vacancies from the dielectric, forming a high dielectric constant capacitor with the dielectric.

2. The method of claim 1 wherein the bias causes the oxygen vacancies to migrate to an exposed surface of the dielectric.

3. The method of claim 1 wherein the bias is an electromagnetic field, an electric field, a magnetic field, a voltage, or a current.

4. The method of claim 1 wherein the bias is approximately 250 kV/cm to approximately 2,000 kV/cm.

5. The method of claim 1 wherein the act of applying the bias applies a substantially uniform bias across the dielectric.

6. The method of claim 1 wherein the act of plasma treating occurs below 500° C.

7. The method of claim 1 wherein the act of plasma treating occurs between approximately 300° C. to approximately 400° C.

8. The method of claim 1 wherein the act of plasma treating occurs between approximately 20° C. to approximately 500° C.

9. The method of claim 1 wherein the act of plasma treating occurs between approximately 20 seconds to approximately 600 seconds.

10. The method of claim 1 wherein the act of plasma treating occurs between approximately 1 mTorr to approximately 10 Torr.

11. The method of claim 1 wherein the act of plasma treating occurs between approximately 100 W to approximately 1,500 W.

12. The method of claim 1 wherein the plasma comprises a gas selected from the group consisting of oxygen, nitrous oxide, and ozone.

13. The method of claim 12 wherein the gas flows between approximately 50 sccm to approximately 5,000 sccm.

14. The method of claim 1 wherein the act of depositing the first electrode deposits the first electrode over at least a portion of a poly plug.

15. The method of claim 14 further comprising the act of depositing a barrier layer between the first electrode and the poly plug.

16. The method of claim 15 wherein the act of plasma treating the dielectric does not substantially oxidize the barrier layer.

17. The method of claim 14 wherein the act of plasma treating the dielectric does not substantially oxidize the poly plug.

18. A method of reducing oxygen vacancies in a high dielectric constant capacitor comprising:

depositing a first electrode on a semiconductor substrate;

depositing a dielectric with a high dielectric constant above the first electrode, the dielectric having a plurality of oxygen vacancies therein;

applying a bias to the dielectric wherein a polarity of the bias causes the oxygen vacancies to migrate towards a surface of the dielectric; and applying an electrolytic solution to the dielectric wherein the electrolytic solution comprises oxygen ions that react with the oxygen vacancies to fill at least a portion of the oxygen vacancies from the dielectric.

19. The method of claim 18 wherein the bias causes the oxygen vacancies to migrate to an exposed surface of the dielectric.

20. The method of claim 18 wherein the bias is an electromagnetic field, an electric field, a magnetic field, a voltage, or a current.

21. The method of claim 18 wherein the bias is approximately 250 kV/cm to approximately 2000 kV/cm.

22. The method of claim 18 wherein the act of applying a bias applies a substantially uniform bias across the dielectric.

23. The method of claim 18 wherein the act of applying the electrolytic solution occurs between approximately 20° C. to approximately 100° C.

24. The method of claim 18 wherein the electrolytic solution comprises oxygen ions, water and a substance selected from the group consisting of sodium chloride, ammonium acetate, ammonium chloride, sodium hydroxide, potassium hydroxide, and ammonia.

25. The method of claim 24 wherein the oxygen ions are formed by bubbling a substance selected from the group consisting of oxygen, ozone, and nitrous oxide into the electrolytic solution.

26. The method of claim 18 wherein the act of depositing the first electrode deposits the first electrode over at least a portion of a poly plug.

27. The method of claim 26 further comprising the act of depositing a barrier layer between the first electrode and the poly plug.

28. The method of claim 27 wherein the act of applying the electrolytic solution to the dielectric does not substantially oxidize the barrier layer.

29. The method of claim 26 wherein the act of applying the electrolytic solution to the dielectric does not substantially oxidize the poly plug.

30. A method of reducing oxygen vacancies in a dielectric comprising:

applying a bias to a dielectric to cause oxygen vacancies in the dielectric to migrate towards a surface of the dielectric; and plasma treating the dielectric with oxygen ions which react with at least a portion of the oxygen vacancies in the dielectric.

31. The method of claim 30 wherein the bias causes the oxygen vacancies to migrate to an exposed surface of the dielectric.

32. The method of claim 30 wherein the bias is an electromagnetic field, an electric field, a magnetic field, a voltage, or a current.

33. The method of claim 30 wherein the bias is approximately 250 kV/cm to approximately 2,000 kV/cm.

34. The method of claim 30 wherein the act of applying the bias applies a substantially uniform bias across the dielectric.

35. The method of claim 30 wherein the act of plasma treating occurs below 500° C.

36. The method of claim 30 wherein the act of plasma treating occurs between approximately 300° C. to approximately 400° C.

37. The method of claim 30 wherein the act of plasma treating occurs between approximately 20° C. to approximately 500° C.

38. The method of claim 30 wherein the act of plasma treating occurs between approximately 20 seconds to approximately 600 seconds.

39. The method of claim 30 wherein the act of plasma treating occurs between approximately 1 mTorr to approximately 10 Torr.

40. The method of claim 30 wherein the act of plasma treating occurs between approximately 100 W to approximately 1,500 W.

41. The method of claim 30 wherein the plasma comprises a gas selected from the group consisting of oxygen, nitrous oxide, and ozone.

42. The method of claim 41 wherein the gas flows between approximately 50 sccm to approximately 5,000 sccm.

43. A method of reducing oxygen vacancies in a dielectric comprising:
   applying a bias to a dielectric to cause oxygen vacancies in the dielectric to migrate towards a surface of the dielectric; and
   applying an electrolytic solution to the dielectric wherein oxygen ions in the electrolytic solution react with at least a portion of the oxygen vacancies in the dielectric.

44. The method of claim 43 wherein the bias causes the oxygen vacancies to migrate to an exposed surface of the dielectric.

45. The method of claim 43 wherein the bias is an electromagnetic field, an electric field, a magnetic field, a voltage, or a current.

46. The method of claim 43 wherein the bias is approximately 250 kV/cm to approximately 2,000 kV/cm.

47. The method of claim 43 wherein the act of applying the bias applies a substantially uniform bias across the dielectric.

48. The method of claim 43 wherein the act of applying the electrolytic solution occurs between approximately 20° C. to approximately 100° C.

49. The method of claim 43 wherein the electrolytic solution comprises oxygen ions, water and a substance selected from the group consisting of sodium chloride, ammonium acetate, ammonium chloride, sodium hydroxide, potassium hydroxide, and ammonia.

50. The method of claim 49 wherein the oxygen ions are formed by bubbling a substance selected from the group consisting of oxygen, ozone, and nitrous oxide into the electrolytic solution.

51. A method of reducing oxygen vacancies in a dielectric on a semiconductor, the method comprising:
   depositing on a semiconductor substrate, a dielectric with a high dielectric constant, the dielectric having a plurality of oxygen vacancies therein;
   applying a bias to the dielectric wherein the bias causes the oxygen vacancies in the dielectric to migrate towards a surface of the dielectric; and
   applying an electrolytic solution to the dielectric wherein the electrolytic solution comprises oxygen ions that react with the oxygen vacancies to thereby fill a portion of the oxygen vacancies from the dielectric.

52. The method of claim 51 wherein the bias causes the oxygen vacancies to migrate to an exposed surface of the dielectric.

53. The method of claim 51 wherein the bias is an electromagnetic field, an electric field, a magnetic field, a voltage, or a current.

54. The method of claim 51 wherein the bias is approximately 250 kV/cm to approximately 2,000 kV/cm.

55. The method of claim 51 wherein the act of applying the bias applies a substantially uniform bias across the dielectric.

56. The method of claim 51 wherein the act of applying the electrolytic solution occurs between approximately 20° C. to approximately 100° C.

57. The method of claim 51 wherein the electrolytic solution comprises oxygen ions, water and a substance selected from the group consisting of sodium chloride, ammonium acetate, ammonium chloride, sodium hydroxide, potassium hydroxide, and ammonia.

58. The method of claim 57 wherein the oxygen ions are formed by bubbling a substance selected from the group consisting of oxygen, ozone, and nitrous oxide into the electrolytic solution.

59. The method of claim 51 wherein the act of subjecting the dielectric to electrolysis does not substantially oxidize the substrate.

60. A method of reducing oxygen vacancies in a memory cell comprising:
   depositing a first electrode over a portion of a poly plug;
   depositing a dielectric over the first electrode, the dielectric having a plurality of oxygen vacancies therein; and
   applying a bias that causes the oxygen vacancies in the dielectric to migrate towards a surface of the dielectric.

61. The method of claim 60 further comprising the acts of:
   plasma treating the dielectric with a plurality of oxygen ions wherein at least a portion of oxygen ions react with the oxygen vacancies in the dielectric; and
   depositing a second electrode over at least a portion of the dielectric.

62. The method of claim 61 wherein the act of plasma treating occurs below 500° C.

63. The method of claim 61 wherein the act of plasma treating occurs between approximately 300° C. to approximately 400° C.

64. The method of claim 61 wherein the act of plasma treating occurs between approximately 20° C. to approximately 500° C.

65. The method of claim 61 wherein the act of plasma treating occurs between approximately 20 seconds to approximately 600 seconds.

66. The method of claim 61 wherein the act of plasma treating occurs between approximately 1 mTorr to approximately 10 Torr.

67. The method of claim 61 wherein the act of plasma treating occurs between approximately 100 W to approximately 1,500 W.

68. The method of claim 61 wherein the plasma comprises a gas selected from the group consisting of oxygen, nitrous oxide, and ozone.

69. The method of claim 61 wherein the gas flows between approximately 50 sccm to approximately 5,000 sccm.

70. The method of claim 61 wherein the act of plasma treating does not substantially oxidize the poly plug.

71. The method of claim 61 wherein the act of plasma treating the dielectric does not degrade the first electrode.

72. The method of claim 61 further comprising the act of depositing a barrier layer between the poly plug and the dielectric.

73. The method of claim 72 wherein the act of plasma treating the dielectric does not substantially oxidize the barrier layer.

74. The method of claim 60 further comprising the acts of:
   subjecting the dielectric to electrolysis wherein oxygen ions in an electrolytic solution react with the oxygen vacancies in the dielectric; and
   depositing a second electrode over at least a portion of the dielectric.

75. The method of claim 74 wherein the act of subjecting the dielectric to electrolysis occurs between approximately 20° C. to approximately 100° C.

76. The method of claim 74 wherein the electrolytic solution comprises oxygen ions, water, and a substance selected from the group consisting of sodium chloride, ammonium acetate, ammonium chloride, sodium hydroxide, potassium hydroxide, and ammonia.

77. The method of claim 76 wherein the oxygen ions are formed by bubbling a substance selected from the group consisting of oxygen, ozone, and nitrous oxide, into the electrolytic solution.

78. The method of claim 74 wherein the act of subjecting the dielectric to electrolysis does not substantially oxidize the poly plug.

79. The method of claim 74 wherein the act of subjecting the dielectric to electrolysis does not degrade the first electrode.

80. The method of claim 74 further comprising the act of depositing a barrier layer between the poly plug and the dielectric.

81. The method of claim 80 wherein the act of subjecting the dielectric to electrolysis does not substantially oxidize the barrier layer.

82. The method of claim 60 wherein the bias causes the oxygen vacancies to migrate to an exposed surface of the dielectric.

83. The method of claim 60 wherein the bias is an electromagnetic field, an electric field, a magnetic field, a voltage, or a current.

84. The method of claim 60 wherein the bias is approximately 250 kV/cm to approximately 2,000 kV/cm.

85. The method of claim 60 wherein the act of applying the bias applies a substantially uniform bias across the dielectric.

86. A method of reducing oxygen vacancies in a metal-insulator-metal structure comprising:
depositing a first metal electrode over a substrate;
depositing a dielectric over the first metal electrode, the dielectric having a plurality of oxygen vacancies therein; and
applying a bias that causes the oxygen vacancies in the dielectric to migrate.

87. The method of claim 86 further comprising the acts of:
plasma treating the dielectric with a plurality of oxygen ions wherein the oxygen ions fill at least a portion of the oxygen vacancies in the dielectric; and
depositing a second metal electrode over the dielectric.

88. The method of claim 87 wherein the act of plasma treating occurs below 500° C.

89. The method of claim 87 wherein the act of plasma treating occurs between approximately 300° C. to approximately 400° C.

90. The method of claim 87 wherein the act of plasma treating occurs between approximately 20° C. to approximately 500° C.

91. The method of claim 87 wherein the act of plasma treating occurs between approximately 20 seconds to approximately 600 seconds.

92. The method of claim 87 wherein the act of plasma treating occurs between approximately 1 mTorr to approximately 10 Torr.

93. The method of claim 87 wherein the act of plasma treating occurs between approximately 100 W to approximately 1,500 W.

94. The method of claim 87 wherein the plasma comprises a gas selected from the group consisting of oxygen, nitrous oxide, and ozone.

95. The method of claim 94 wherein the gas flows between approximately 50 sccm to approximately 5,000 sccm.

96. The method of claim 87 wherein the act of plasma treating does not degrade the first metal electrode.

97. The method of claim 86 further comprising the acts of:
subjecting the dielectric to electrolysis wherein oxygen ions in an electrolytic solution react with at least a portion of the oxygen vacancies in the dielectric; and
depositing a second metal electrode over the dielectric.

98. The method of claim 97 wherein the act of subjecting the dielectric to electrolysis occurs between approximately 20° C. to approximately 100° C.

99. The method of claim 97 wherein the electrolytic solution comprises oxygen ions, water, and a substance selected from the group consisting of sodium chloride, ammonium acetate, ammonium chloride, sodium hydroxide, potassium hydroxide, and ammonia.

100. The method of claim 99 wherein the oxygen ions are formed by bubbling a substance selected from the group consisting of oxygen, ozone, and nitrous oxide into the electrolytic solution.

101. The method of claim 97 wherein the act of subjecting the dielectric to electrolysis does not substantially oxidize the first metal electrode.

102. The method of claim 97 wherein the act of subjecting the dielectric to electrolysis does not substantially oxidize the substrate.

103. The method of claim 86 wherein the bias causes the oxygen vacancies to migrate to an exposed surface of the dielectric.

104. The method of claim 86 wherein the bias is an electromagnetic field, an electric field, a magnetic field, a voltage, or a current.

105. The method of claim 86 wherein the bias is approximately 250 kV/cm to approximately 2000 V/cm.

106. The method of claim 86 wherein the act of applying the bias applies a substantially uniform bias across the dielectric.

107. The method of claim 86 wherein the act of depositing the first metal electrode deposits the first metal electrode over at least a portion of a poly plug.

108. The method of claim 107 wherein the act of plasma treating the dielectric does not substantially oxidize the poly plug.

109. The method of claim 107 further comprising the act of depositing a barrier layer between the first metal electrode and the poly plug.

110. The method of claim 109 wherein the act of plasma treating the dielectric does not substantially oxidize the barrier layer.

111. The method of claim 109 wherein the act of subjecting the dielectric to electrolysis does not substantially oxidize the barrier layer.

112. The method of claim 107 wherein the act of subjecting the dielectric to electrolysis does not substantially oxidize the poly plug.

113. A method of reducing oxygen vacancies comprising:
applying a bias that causes a plurality of oxygen vacancies in a material to migrate; and
reducing the plurality of oxygen vacancies by subjecting the material to an oxidizing treatment.

114. The method of claim 113 wherein the material is a dielectric.

115. The method of claim 113 wherein the bias is an electromagnetic field, an electric field, a magnetic field, a voltage, or a current.

116. The method of claim 113 wherein the bias causes the oxygen vacancies to migrate to a surface of the material.

117. The method of claim 113 wherein subjecting the material to an oxidizing treatment comprises plasma treating the material.

118. The method of claim 117 wherein the plasma treating applies a plurality of oxygen ions to the material.

119. The method of claim 113 wherein subjecting the material to an oxidizing treatment applies an electrolytic solution to the material.

120. The method of claim 119 wherein the electrolytic solution applies a plurality of oxygen ions to the material.

* * * * *

UNITED STATES PATENT AND TRADEMARK OFFICE
CERTIFICATE OF CORRECTION

PATENT NO.    : 6,849,494 B2
DATED         : February 1, 2005
INVENTOR(S)   : Cem Basceri and Gurtej S. Sandhu It is certified that error appears in the above-identified patent and that said Letters Patent is hereby corrected as shown below:

Title page,
Item [56], References Cited, U.S. PATENT DOCUMENTS,
after "RE36,786 E" delete "7/2000" and insert -- 01/1996 --.
OTHER PUBLICATIONS,
"Lo et al." reference, after "et al". insert -- , --.

Column 4,
Line 67, delete ""substance"" and insert -- "substrate" --.

Column 5,
Line 12, after "(BPSG)" insert -- . --.
Line 13, delete "depending" and insert -- Depending --.

Column 6,
Line 18, delete "(TaIN)" and insert -- (TaN), --.

Column 9,
Line 15, after "like" insert -- . --.

Column 16,
Line 11, delete "2000" and insert -- 2,000 --.

Column 19,
Line 11, after "oxide" delete ",".

UNITED STATES PATENT AND TRADEMARK OFFICE
CERTIFICATE OF CORRECTION

PATENT NO. : 6,849,494 B2
DATED : February 1, 2005
INVENTOR(S) : Cem Basceri and Gurtej S. Sandhu It is certified that error appears in the above-identified patent and that said Letters Patent is hereby corrected as shown below:

<u>Column 20,</u>
Line 36, delete "2000" and insert -- 2,000 --.
Line 36, after "2000" insert -- k --.

Signed and Sealed this

Thirteenth Day of June, 2006

JON W. DUDAS
*Director of the United States Patent and Trademark Office*